United States Patent
Choi et al.

(10) Patent No.: US 10,790,016 B2
(45) Date of Patent: Sep. 29, 2020

(54) PROBABILISTIC NEURON CIRCUITS

(71) Applicant: Western Digital Technologies, Inc., San Jose, CA (US)

(72) Inventors: Won Ho Choi, San Jose, CA (US); Young-Suk Choi, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 35 days.

(21) Appl. No.: 15/910,606

(22) Filed: Mar. 2, 2018

(65) Prior Publication Data
US 2019/0272870 A1 Sep. 5, 2019

(51) Int. Cl.
| | | |
|---|---|---|
| G11C 11/54 | (2006.01) | |
| H01L 43/08 | (2006.01) | |
| G11C 11/16 | (2006.01) | |
| H01F 10/32 | (2006.01) | |
| H01L 27/22 | (2006.01) | |
| H01L 43/02 | (2006.01) | |

(52) U.S. Cl.
CPC ............ G11C 11/54 (2013.01); G11C 11/161 (2013.01); G11C 11/1673 (2013.01); G11C 11/1675 (2013.01); H01F 10/329 (2013.01); H01F 10/3254 (2013.01); H01F 10/3286 (2013.01); H01L 27/222 (2013.01); H01L 43/02 (2013.01); H01L 43/08 (2013.01)

(58) Field of Classification Search
CPC ..... G11C 11/54; G11C 11/16; G11C 11/1673; G11C 11/1675
See application file for complete search history.

(56) References Cited

U.S. PATENT DOCUMENTS

| | | |
|---|---|---|
| 7,969,767 B2 | 6/2011 | Li et al. |
| 9,368,716 B2 | 6/2016 | Gu et al. |
| 9,620,706 B2 | 4/2017 | Lee et al. |
| 9,953,690 B2 * | 4/2018 | Augustine .............. G06N 3/049 |

(Continued)

OTHER PUBLICATIONS

Sengupta, Abhronil et al., "Magnetic Tunnel Junction Mimics Stochastic Cortical Spiking Neurons," Purdue University, School of Electrical & Computer Engineering, USA, 9 pages.

(Continued)

*Primary Examiner* — Jay W. Radke
(74) *Attorney, Agent, or Firm* — Volpe and Koenig, P.C.

(57) ABSTRACT

Neuron circuit structures are presented which employ magnetic tunnel junction (MTJ) elements that change state probabilistically in response to application of electrical source currents that emulate synaptic activity. Some implementations form probabilistic neuron circuits using homogeneous perpendicular spin-transfer torque (STT) MTJ elements. These neuron circuits include a perpendicular STT reference MTJ element coupled via an electrical node with a perpendicular STT neuron MTJ element that can change state. The electrical node for each neuron circuit couples a neuron MTJ element or "perturbation" element to a reference element, and also to an electrical current employed to influence probabilistic magnetization state changes in the perturbation MTJ element. A read current can be applied to the perturbation element to produce an output voltage at the electrical node indicative of a magnetization state of the perturbation element.

24 Claims, 6 Drawing Sheets

(56) References Cited

U.S. PATENT DOCUMENTS

| | | | |
|---|---|---|---|
| 2006/0092689 A1* | 5/2006 | Braun | G11C 7/067 |
| | | | 365/158 |
| 2010/0258887 A1 | 10/2010 | Zhu et al. | |
| 2010/0302843 A1 | 12/2010 | Li et al. | |
| 2011/0078538 A1* | 3/2011 | Ikegawa | G11C 11/1675 |
| | | | 714/758 |
| 2011/0229985 A1 | 9/2011 | Li | |
| 2012/0280337 A1 | 11/2012 | Cao et al. | |
| 2013/0175644 A1 | 7/2013 | Horng et al. | |
| 2013/0293286 A1* | 11/2013 | Li | G11C 7/062 |
| | | | 327/538 |
| 2014/0099735 A1 | 4/2014 | Horng et al. | |
| 2016/0371582 A1* | 12/2016 | Eleftheriou | G06N 3/049 |
| 2017/0365313 A1* | 12/2017 | Augustine | G06N 3/049 |

OTHER PUBLICATIONS

Choi, Won Ho et al., "A Magnetic Tunnel Junction Based True Random Number Generator with Conditional Perturb and Real-Time Output Probability Tracking," Dept. of ECE, University of Minnesota, USA, 4 pages.

Nessler et al., "Bayesian Computation Emerges in Generic Cortical Microcircuits through Spike-Timing-Dependent Plasticity," PLoS Comput Biol 9, e1003037, 2013, 30 pages.

* cited by examiner

PROBABILISTIC NEURON CIRCUITS

TECHNICAL FIELD

Aspects of the disclosure are related to the field of artificial electrical/magnetic neuron circuitry in artificial neural networks.

BACKGROUND

Artificial neural networks (ANN) can be formed from individual artificial neurons that are emulated using software, integrated hardware, or other discrete elements. Biological neurons typically produce a 'spike' output in response to various synaptic inputs to the neuron cell body, and these artificial neurons attempt to emulate this behavior.

Past research on hardware implementation of spiking neurons has mainly focused on deterministic neural models, and often employed area-expensive complementary metal-oxide-semiconductor (CMOS) implementations involving a large number of transistors for each neuron. Further, such deterministic neuron models were unable to fully emulate neural computation in biological systems, which are significantly prone to noise arising from associated synapses, dendrites, or neuron cells.

More recent theoretical studies have been performed to demonstrate that Bayesian computation can be performed in neural networks inspired from cortical microcircuits of pyramidal "stochastic" neurons. Such neurons, observed in the biological cortex, spike stochastically, and the probability of firing at a particular time is a non-linear function of the instantaneous magnitude of the resultant post-synaptic current input to the neuron.

Attempts at employing magnetic tunnel junctions (MTJs) into neuron circuits have been undertaken. MTJs operate using tunnel magnetoresistance (TMR), which is a magnetoresistive effect. MTJs typically consist of two ferromagnets separated by a thin insulator through which electrons can quantum-mechanically tunnel from one ferromagnet into the other. In the presence of thermal noise, a switching behavior of an MTJ due to flow of an input current can be observed to be stochastic in nature, and the probability of switching increases with the magnitude of the input current. Thus, MTJs can emulate functionality of "stochastic" neurons observed in a biological cortex, where an MTJ neuron "spikes" probabilistically depending on a synaptic input, in a manner similar to biological neurons.

However, present approaches place an in-plane spin-transfer torque (STT) reference MTJ in series with an in-plane spin orbit torque (SOT) neuron MTJ that has an additional heavy metal underlayer, referred to as a heterogeneous in-plane MTJ scheme. In these schemes, separate "write" and "read" current paths are employed, and have resultant poor scalability and high switching currents. Other approaches replace the SOT in-plane neuron MTJ with an SOT perpendicular MTJ that has an external electric field applied. However, this external field significantly degrades thermal stability of neighboring neuron circuitry.

Overview

Neuron circuit structures are presented which employ magnetic tunnel junction (MTJ) elements that change state probabilistically in response to application of electrical source currents that emulate synaptic activity. Some implementations form probabilistic neuron circuits using homogeneous perpendicular spin-transfer torque (STT) MTJ elements. These neuron circuits include a perpendicular STT reference MTJ element coupled via an electrical node with a perpendicular STT neuron MTJ element that can change state. The electrical node for each neuron circuit couples a neuron MTJ element or "perturbation" element to a reference element, and also to an electrical current employed to influence probabilistic magnetization state changes in the perturbation MTJ element. A read current can be applied to the perturbation element to produce an output voltage at the electrical node indicative of a magnetization state of the perturbation element.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
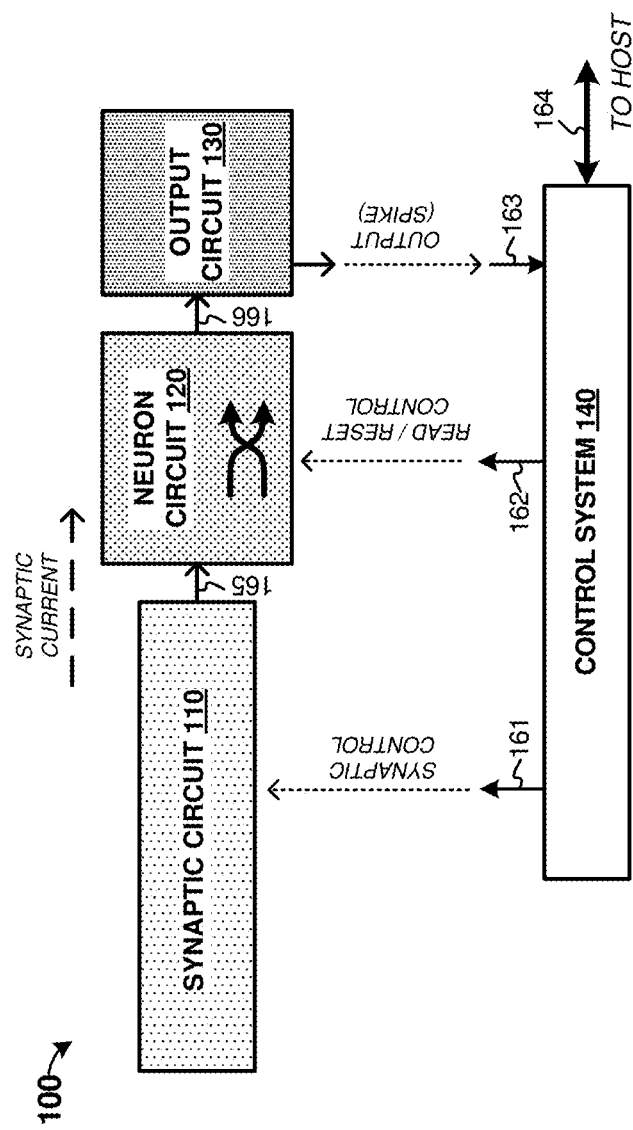
FIG. 1 illustrates an example probabilistic neuron system.

Discussed herein are various enhanced probabilistic neuron circuits and associated interconnect and control systems. These neuron circuits employ perpendicular spin transfer torque (STT) magnetic tunnel junction (MTJs) elements to emulate behavior of biological neurons. In each neuron circuit, at least one perturbation magnetic tunnel junction element is included, referred to herein as a perturbation magnetic tunnel junction element. A perturbation magnetic tunnel junction element, or perturbation MTJ element, is an MTJ element with an alterable magnetization state. At least one reference magnetic tunnel junction element can also be included. A reference magnetic tunnel junction element, referred to herein as a reference MTJ element, is an MTJ element with a magnetization state held in a predetermined state. A perturbation MTJ element is employed in a particular arrangement with a reference MTJ element to form a neuron circuit. As will be discussed herein, changes in a magnetization state of a perturbation MTJ with respect to a reference MTJ can produce probabilistic outputs based in part on stochastic properties of the neuron circuits.

As used herein, magnetic tunnel junction elements, such as a perturbation element, perturbation MTJ element, perturbation magnetic tunnel junction (MTJ) element, reference element, reference MTJ element, or reference magnetic tunnel junction (MTJ) element discussed below, are each components of circuits that consist of two layers of ferromagnetic materials separated by a thin insulator through which electrons can tunnel from one ferromagnetic layer into the other ferromagnetic layer. One ferromagnetic layer of an MTJ can be referred to as a pinned layer which has a fixed magnetization state, while another ferromagnetic layer of an MTJ comprises a free layer which can change in magnetization state. An intermediate layer comprising a thin insulator separating the two ferromagnetic layers can be formed from an oxide material or other suitable electrical insulator. Electrical terminals can be formed to interface the free and pinned layers of the MTJ to other components in a circuit.

Specific arrangements of MTJs are included in the probabilistic neuron circuits discussed herein, namely perpendicular magnetic tunnel junction arrangements. The perpendicular arrangement refers to perpendicular magnetic anisotropy, where MTJs employed have a preferred direction of alignment of magnetization within the MTJ. In perpendicular arrangements, the preferred direction of alignment of associated magnetic moments are perpendicular to a surface of a corresponding semiconductor substrate. Spin-transfer torque (STT) refers herein to devices in which spin polarized currents reversibly switch a magnetization state of a ferromagnetic layer, namely the magnetization state of the free layers discussed herein. In the presence of thermal noise, a switching behavior of the free layer of a perturbation MTJ due to flow of an input current through an associated pinned layer can be observed to be stochastic in nature, and the probability of switching magnetization states in the perturbation MTJ increases with the magnitude of the input current. Thus, the perpendicular STT MTJs discussed herein can emulate functionality of "stochastic" neurons observed in a biological cortex, where an MTJ neuron "spikes" probabilistically depending a synaptic input, similar to biological neurons.

The neuron circuits discussed herein employ arrangements of perpendicular STT MTJs to provide enhanced operation and emulate biological neurons, while having better scalability, manufacturability, and lower switching current than other previous approaches. These previous approaches include the examples described above for heterogeneous in-plane MTJ schemes that include spin orbit torque (SOT) MTJs. Moreover, the neuron circuits that employ perpendicular STT MTJs herein can be assembled into tighter vertical stack-ups. These vertical stack-ups allow for multi-layered "bitline" arrangements, where source current circuitry can be formed into horizontal bitlines and corresponding neuron circuitry can be fit into the vertical pitch of each horizontal bitline. In this manner, large vertical stack-ups of neuron circuits can be built up from semiconductor substrates. Various interconnect and control logic can be formed on the same semiconductor substrate, allowing for large integrated neuron circuits to be established in a compact integrated circuit.

FIG. 1 is presented as a first example of a probabilistic neuron system that employs MTJ elements. FIG. 1 is a system diagram illustrating artificial neuron system 100. System 100 includes synaptic circuit 110, neuron circuit 120, and output circuit 130. Control system 140 is also include as representative of one or more circuits, software, firmware, hardware, or other elements that may control the operations of synaptic circuit 110, neuron circuit 120, and output circuit 130. Synaptic circuit 110 is coupled over link 165 to neuron circuit 120, and neuron circuit 120 is coupled over link 166 to output circuit 130. Control system 140 controls operation of synaptic circuit 110 over one or more links 161. Control system 140 also provides control to neuron circuit 120 over one or more links 162. An output from output circuit 130 can be provided to control system 140 over link 163, or might instead be provided to other circuitry, including other neuron systems. When a host system is employed, communication can occur over link 164. This host system might comprise one or more computer systems, software elements, or other hardware/software control systems.

In operation, synaptic circuit 110 comprises a synaptic current source. A synaptic current source used herein is any current source that establishes an electrical current emulating a synaptic input to a perturbation MTJ element, which might consist of combined outputs of memory bits, circuitry configured to introduce neuron circuit write currents responsive to control/command instructions, transistor current sources, voltage sources which can establish currents resultant from a corresponding source voltage coupled to a free layer of a perturbation MTJ element, or other sources. This synaptic current can be provided to neuron circuit 120 over link 165, which may include one or more switching elements to allow control system 140 to selectively provide the synaptic current during an appropriate neuron circuit write phase. In some examples, synaptic circuit 110 provides a voltage level over link 165 which is used by neuron circuit 120 to establish the synaptic current.

To establish the synaptic current as a current source, a plurality of data bits may be included in synaptic circuit 110, forming a control line, synaptic bitline, or other suitable circuit arrangement. These data bits can be set or otherwise established at target levels by control system 140 via control link 161. Control system 140 can control synaptic weights in synaptic circuit 110 over link 161, as well as control write pulse widths to further control synaptic circuit 110 over link 161. In further examples, inputs to bits of synaptic circuit 110 can comprise outputs of various neuron circuits, forming a network of interconnected neuron circuits.

Once the synaptic current of a selected write pulse width has been established by a synaptic current source and sent to neuron circuit 120, a state of a perturbation element comprising neuron circuit 120 can probabilistically change state from an initial state, or remain in the initial state. This perturbation element can comprise a perpendicular spin transfer torque (STT) MTJ element, which has an alterable magnetization as the state. A first ferromagnetic layer of the MTJ is a free ferromagnetic layer (referred to herein as a free layer), and comprises a ferromagnetic material that permits a magnetic moment of the corresponding ferromagnetic material to change orientation in response to an electromagnetic force. This change in magnetic moment orientation is referred to herein as a magnetization state, which changes relative to a second ferromagnetic layer of the MTJ element. This second ferromagnetic layer is referred to herein as a pinned layer, although other common nomenclature can be used, such as a reference layer or a fixed layer. The pinned layer of the MTJ element is a layer of ferromagnetic material that holds a magnetic moment of the corresponding ferromagnetic material in a predetermined or fixed state even under the influence of the electromagnetic force which might change the state of the free layer. When the free layer and the pinned layer are in the same magnetization state, then the MTJ element is considered to be in a parallel state. When the free layer and the pinned layer are in a different magnetization state, then the MTJ element is considered to be in an anti-parallel state. Thus, the alterable magnetization state of MTJ elements discussed herein can change among two states, namely a parallel state and an anti-parallel state.

Due to the probabilistic configuration of neuron circuit 120, each particular application of the synaptic current to the associated perturbation element may (or may not) change the state of the perturbation element. Thermal noise present in neuron circuit 120, along with any thermal noise variations in the synaptic current itself can add probabilistic or stochastic variability to the state changing behavior of the perturbation element of neuron circuit 120. Properties of the synaptic current, such as magnitude and duration when introduced to neuron circuit 120, can influence the probabilistic or stochastic switching behavior of the associated perturbation element. Thus, repeated neuron write attempts can be performed followed by corresponding neuron read attempts to produce an output.

When a change in state occurs in the perturbation element, a read attempt will produce an output that indicates a change in magnetization state. This output might comprise a voltage spike resultant from application of a read current to the perturbation element. A voltage spike output can comprise a short-duration increase in voltage at an output node resultant from a read current passing through a perturbation MTJ element in series with a reference MTJ element coupled to a reference potential. This output can be provided by an output node for transfer over link 166 and further conditioning, voltage level conversion, or other handling by output circuit 130. A read current of a selected read pulse width can be provided by a read current source of control system 140 over link 162. As used herein, a read current source comprises circuitry that sends a read current through at least a perturbation MTJ element, such as a circuitry configured to produce read currents responsive to control/command instructions, transistor current sources, voltage sources which can establish currents resultant from a voltage introduced to a pinned layer of a perturbation MTJ element in series with a reference MTJ element, or other sources.

After an output is produced, such as the voltage spike output, a reset current can be applied along the same pathway as the read current. This reset current can be established having a selected reset pulse with and sent by control system 140 over link 162. This reset current resets the MTJ element into an initial magnetization state, and can be provided by a reset current source. The reset current source comprises similar circuitry as the read current source, but consists of a higher magnitude voltage or current introduced to a pinned layer of a perturbation MTJ element in series with a reference MTJ element.

Figure 2:
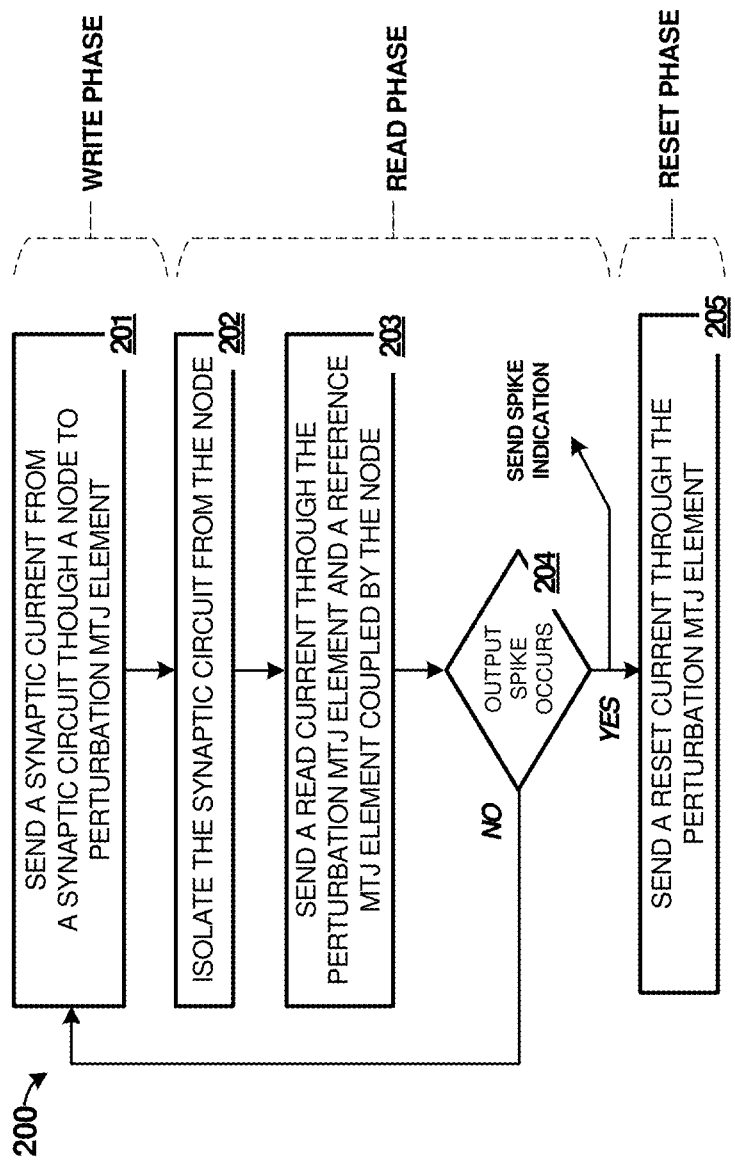
FIG. 2 illustrates an example operation of a probabilistic neuron system.

To further describe operation of the elements of FIG. 1, flow diagram 200 is presented in FIG. 2. FIG. 2 illustrates an example operation of a probabilistic neuron system. The operations of FIG. 2 can be applied to elements of any of the example neuron systems or neuron circuits herein. However, for clarity, the operations of FIG. 2 will be discussed in the context of elements of FIG. 1. Operations of FIG. 2 can be controlled by control system 140 over links 161-163 or by an associated host over link 164.

Write operations, read operations, and reset operations are performed that involve associated 'phases' of control of neuron circuit 120. Reset operations are performed to place a perturbation MTJ element of neuron circuit 120 into a chosen initial magnetization state. Reset operations are performed before usage of neuron circuit 120, as well as after a magnetization state change in the perturbation MTJ element. Write operations are performed to attempt to induce a magnetization state change in the perturbation MTJ element of neuron circuit 120, such as to produce a probabilistic change in magnetization state of the perturbation MTJ element due in part to stochastic properties of neuron circuit 120. The magnetization state of the perturbation MTJ element can change from the initial state established by the reset operation to a resultant state after completion of the write operation which applies a synaptic current to neuron circuit 120. Read operations are performed after each write operation to determine if the perturbation MTJ element has changed magnetization state responsive to the write operation.

Turning now to the operations of FIG. 2, the three phases of operation mentioned above are presented: a write phase, a read phase, and a reset phase. During a write phase, a synaptic current of a selected write pulse duration is sent (201) from synaptic circuit 110 through an electrical node to a perturbation magnetic tunnel junction (MTJ) element of neuron circuit 120 which stochastically influences a magnetization state of the perturbation MTJ element. Application of the synaptic current to neuron circuit 120 can be controlled via link 161. The perturbation MTJ element might be coupled via the electrical node with a reference element, which might comprise another MTJ element of neuron circuit 120. However, the reference element could be any active or passive electrical component, such as a resistor or resistors. The synaptic current can be generated as an output from a plurality of data elements coupled in parallel to link 165. Each of the plurality of data elements can output a corresponding portion of the synaptic current that stochastically influences a change in the magnetization state of the perturbation MTJ element. Each of the plurality of data elements can be set to a desired state over link 161 prior to application of the synaptic current over link 165.

After the synaptic current has been applied to the perturbation MTJ element in the write phase, a read phase can occur. During the read phase, synaptic circuit 110 is first isolated (202) from the electrical node and thus the perturbation MTJ element. A read current of a selected read pulse duration is produced and sent (203) over link 162 through the perturbation MTJ element and the reference MTJ element coupled by the electrical node. This read current might produce a change in an output voltage at the node that indicates a change in magnetization state from an initial state of the perturbation MTJ. At the node, the output voltage might comprise an output voltage spike which can be detected by control system 140 through output circuit 130 and link 163. If the voltage spike occurs (204), then a corresponding output produced by output circuitry 130 can be used to drive further circuitry or processes. An indication of this output voltage spike can be converted by output circuitry 130 into other output formats, logic levels for use by further circuitry or processes. If the voltage spike is not produced responsive to the read current, then control system 140 can determine that a change in magnetization state of the perturbation MTJ element did not occur. The write phase and read phase are repeated until a voltage spike occurs at the node during the read phase.

Once a voltage spike is detected, or any corresponding output from output circuit 130, a reset phase can be performed. A reset current of a selected reset pulse duration is established which places the perturbation MTJ element into a desired initial magnetization state in preparation for another write-read cycle. Furthermore, individual data elements of synaptic circuit 110 can be set to desired bit levels during the reset phase. To reset the perturbation MTJ element, a reset current is applied (205) via link 162. The reset current is similar in nature to the read current, but larger in magnitude than the read current. Responsive to the reset current, the perturbation MTJ element is placed into a corresponding magnetization state.

Figure 3:
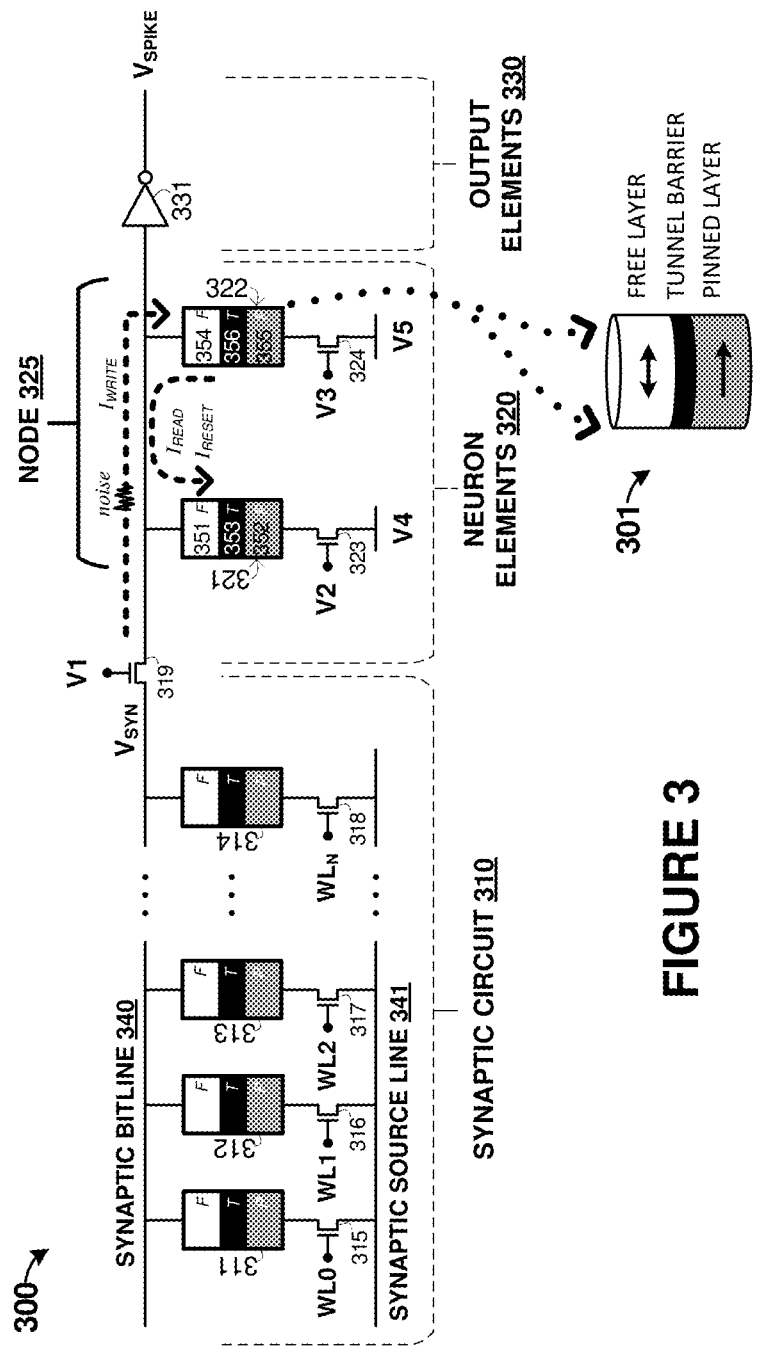
FIG. 3 illustrates an example probabilistic neuron circuit.

To further describe the elements discussed for FIGS. 1 and 2, a more detailed circuit representation is now presented. FIG. 3 illustrates example probabilistic neuron circuitry, represented by circuitry 300. Circuitry 300 includes synaptic circuit 310, neuron elements 320, and output elements 330. In some examples, synaptic circuit 310 comprises an example implementation of synaptic circuit 110 of FIG. 1, neuron elements 320 comprise an example implementation of neuron circuit 120, and output elements 330 comprise an example implementation of output circuit 130, although variations are possible. Various inputs and outputs to the elements of circuitry 300 can be provided by a host or control system, such as control system 140 of FIG. 1, among other control logic and circuitry.

FIG. 3 also includes a detailed view of perturbation element 322, which can be representative of any MTJ discussed herein. As seen in view 301, a free ferromagnetic layer and a pinned ferromagnetic layer are formed with a tunnel barrier layer separating the two ferromagnetic layers. For each of the MTJ elements in FIG. 3, the free layer is labeled with an F, the tunnel barrier layer is labeled with a T, and the pinned layer is labeled with a P. The pinned layer typically has a fixed or otherwise unchanging magnetization, which is shown in an example orientation in FIG. 3. The free layer has an alterable or changeable magnetization, which is shown accordingly in FIG. 3. The reference MTJ element discussed herein can comprise an MTJ element similar to the perturbation MTJ element, but having a magnetization state held in a predetermined state due to the selection of applied control voltages. However, the reference MTJ element or reference magnetic tunnel junction (MTJ) element used herein can instead comprise any reference element to form a voltage divider with the perturbation MTJ element that has an output voltage at an output node, such as a resistor, resistor network, transistor circuitry, passive or active electrical components, or other circuitry.

Synaptic circuit 310 comprises a plurality of 1-n MTJ elements coupled in a parallel fashion, with four example MTJs, represented by MTJs 311-314 in FIG. 3. Synaptic bitline 340 couples a free layer terminal of each of MTJs 311-314 to each other, while a select line couples a switching element to a pinned layer terminal for each of MTJs 311-314. Synaptic bitline 340 might be referred to as a bitline in some examples, such as when MTJs 311-314 comprise a plurality of memory bits arranged into a bitline. This bitline can have a number of data bits corresponding to the number of MTJ elements. Switching elements or selection elements, namely transistors 315-318, are included to allow magnetization states of each of MTJs 311-314 to be altered independently of each other. These magnetization states can be altered by controlling activation of wordlines (WL) 0-n and placing 'data' bits on synaptic source line 341 that are reflective of the desired magnetization states to be written into selected ones of MTJ 311-314. In this manner, each of MTJs 311-314 can have different magnetization states established which reflect individual data bits stored therein. MTJs 311-314 can provide an output via synaptic bitline 340 that is reflective of a composite summation or combination output from all of MTJs 311-314.

The individual MTJs can be set into parallel or antiparallel magnetization states to produce a 'synaptic' voltage ($V_{SYN}$) which in turn produces an associated synaptic current or write current ($I_{WRITE}$) to node 325 when transistor 319 is enabled. The combination output of MTJs 311-314 can be employed to provide a synaptic current with a magnitude and duration which is based in part on the data bits stored by MTJs 311-314. It should be noted that the output of synaptic bitline 340 can comprise $V_{SYN}$, which after passing through transistor 319, produces $I_{WRITE}$. Instead of MTJ elements, any memory device can be employed to store individual data bits and produce an output as $V_{SYN}$, such as flash memory cells, phase change memory cells, magnetic memory cells, or other data bit storage elements. Furthermore, any number of MTJs might be provided in a bitline or other structural arrangement. These number of MTJs can be included to adjust properties, granularity, resolution, or other properties of $V_{SYN}$ and consequently $I_{WRITE}$. In other examples, a write voltage ($V_{SYN}$) might not be produced by associated data bit elements, and instead a synaptic current might be more directly produced.

As mentioned above, data bits that are input to each of MTJs 311-314 can be selected to produce a desired output synaptic current. Also, the data bits might be derived or received from other active circuitry, such as outputs from further neuron circuitry. For example, an output produced by output elements 330 might be used as an input to one or more further neuron circuits. This input can be placed onto a select line of another neuron, or more than one neuron. In this manner, many neuron circuits can be interconnected via inputs and outputs to establish a large network or neural net of neuron circuits. In other examples, bits are written into MTJs 311-314 from outputs of other neurons tied to WL selectors for associated transistors, and a particular logic level (high/low) is held on synaptic source line 341. As will be discussed in FIG. 6 below, a compact integrated neuron system can be established using these arrangements.

Turning now to operation of neuron elements 320, both reference element 321 and perturbation element 322 are included. Reference element 321 and perturbation element 322 both comprise perpendicular STT MTJs. Reference element 321 has free layer 351, pinned layer 352, and tunnel layer 353. Perturbation element 322 has free layer 354, pinned layer 355, and tunnel layer 356. Reference element 321 and perturbation element 322 are coupled to node 325 via terminals associated with free layers 351 and 354. Due to both reference element 321 and perturbation element 322 comprising perpendicular STT MTJs, a 'homogenous' configuration is achieved. In this example, the free layer of each of reference element 321 and perturbation element 322 are coupled via node 325, although variations are possible. Transistors 323 and 324 are provided to selectively couple reference element 321 and perturbation element 322 to appropriate voltages (V4/V5) during operation. Reference element 321 and perturbation element 322 can form a voltage divider at node 325 when a read current is directed through perturbation element 322 and reference element 321. Control of transistors 323 and 324 is provided via nodes V2 and V3, respectively, and can be established by a control system or circuitry, such as that discussed above for control system 140. Further discussion of timing and control of nodes V1-V5 is discussed in FIG. 4 below.

During operation, a repetitive cycle of a write phase and a read phase is performed until perturbation element 322 changes state. The write phase includes application of a synaptic current or neuron write current ($I_{WRITE}$) to node 325 as provided by synaptic circuit 310. This application of $I_{WRITE}$ is controlled by operation of node V1 and transistor 319. Once applied, $I_{WRITE}$ can influence a magnetization state of perturbation element 322, while reference element 321 is decoupled from V4 by deactivation of transistor 323. Thermal noise, among other noise sources, is also present within perturbation element 322 and $I_{WRITE}$, and this thermal noise can contribute to a stochastic performance of perturbation element 322. This stochastic performance leads to a quasi-random or probabilistic switching of states by perturbation element 322 from an initial magnetization state to a final magnetization state when $I_{WRITE}$ is applied. To determine if perturbation element 322 has switched states, a read current ($I_{READ}$) is applied by coupling node V5 to a terminal associated with pinned layer 355 of perturbation element 322. This read current is provided to node 325, and reference element 321 is coupled to an electrical reference or ground potential through node V4 and transistor 323. When perturbation element 322 has changed states, then a voltage spike is produced at node 325 which is provided as a desired logic level using output elements 330. Once an output indicative of a state change by perturbation element 322 is detected, then perturbation element 322 can be reset into the initial magnetization state using a reset current ($I_{RESET}$) introduced to node 325 by a voltage at node V5. After the reset current has been applied, a current write phase/read phase cycle can be halted or begun anew, as desired.

Although a logic inverter 331 is shown as comprising output elements 330, other signal conditioning and conversion elements can be included. These other elements might comprise tristate buffers, logic gates, voltage conversion circuitry, analog-to-digital conversion circuitry, operational amplifiers, or other elements, including combinations thereof. Output elements 330 might be included in neuron elements 320, or even omitted, if a next circuit in series with neuron elements 320 includes appropriate circuitry. Also, transistor 319 is shown as included in either synaptic circuit 310 or neuron elements 320, depending upon implementation.

Transistors 315-319 and 323-324 each can comprise one or more switching elements or selection elements. As discussed herein switching elements or selection elements can comprise transistor switching elements. In some examples, the switching elements or selection elements each comprise n-type, p-type, normally-on, or normally-off transistors. In some examples, the switching elements or selection elements can instead each comprise transmission gates, or other switching elements. Also, as used herein, an output node, such as node 325, is an electrical connection node, which might act as an input node for synaptic/write currents and an output node for voltage spike outputs.

Figure 4:
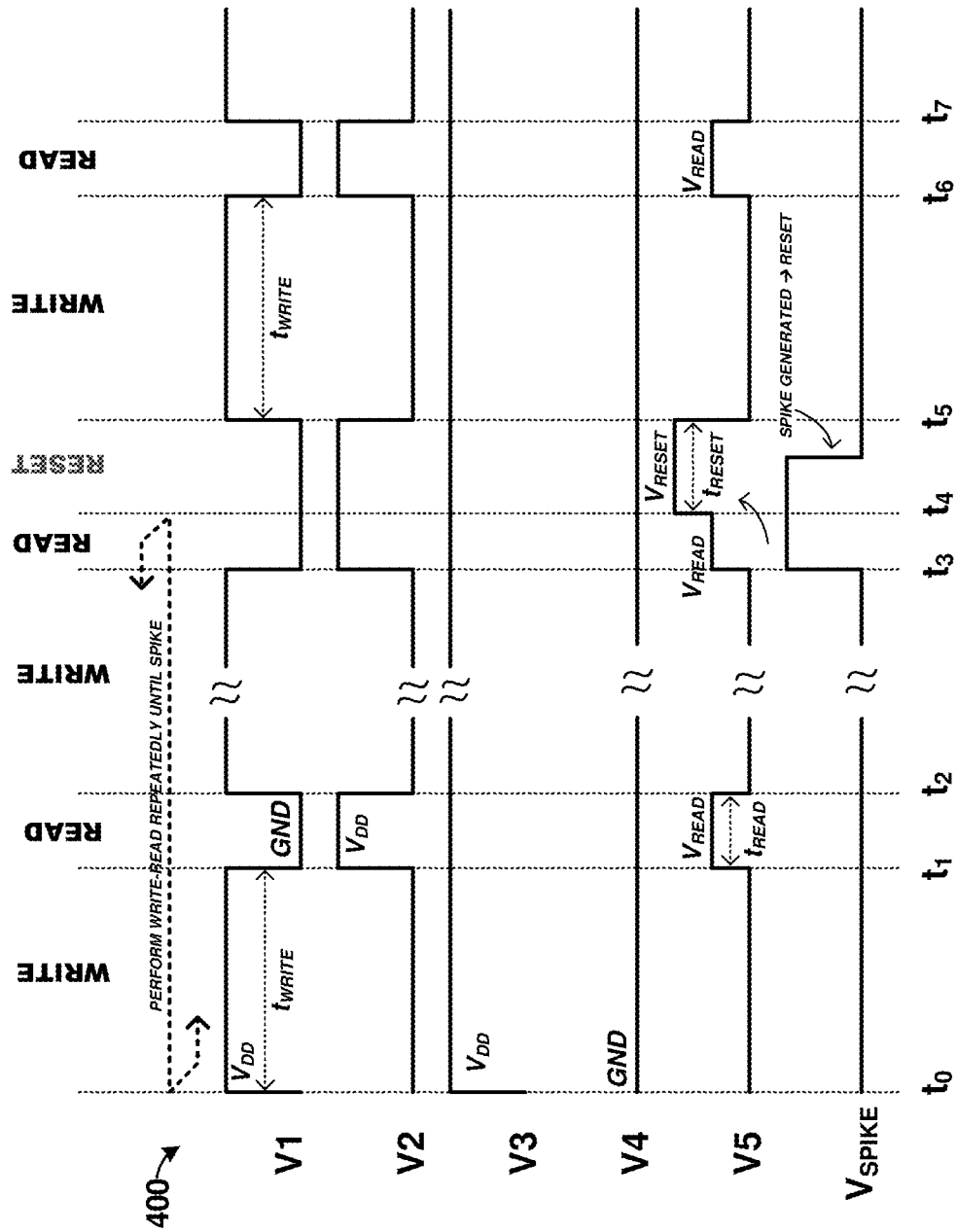
FIG. 4 illustrates example control operations of a probabilistic neuron circuit.

FIG. 4 is a waveform diagram presented to illustrate example control processes for the probabilistic neuron circuit elements of FIG. 3. Operations 400 are provided in FIG. 4 which include example voltage waveforms corresponding to control signals V1-V5 indicated in FIG. 3, as well as an example output signal ($V_{SPIKE}$).

At an initial timeframe, between $t_0$ and $t_1$, a write phase occurs. This write phase includes setting associated control voltages to nodes V1-V5 to enable $I_{WRITE}$ to flow to perturbation element 322. Specifically, node V1 is set to a high logical level (or $V_{DD}$) to enable transistor 319 and allow $V_{SYN}$ to propagate $I_{WRITE}$ to node 325. $I_{WRITE}$ then can probabilistically switch a state of perturbation element 322 depending on the magnitude and duration of $I_{WRITE}$. Node V2 is set to a low logical level, such as a ground potential or electrical reference, to disconnect or decouple reference element 321 from node V4. When reference element 321 is disconnected from node V4, $I_{WRITE}$ influences the state of perturbation element 322 and not reference element 321. Node V4 can be coupled to ground throughout all phases of FIG. 4. Typically, reference element 321 is held in a particular, predetermined magnetization state, which might be a magnetization state held in an antiparallel state (AP). Node V3 is coupled to $V_{DD}$ to ensure that transistor 324 is enabled to couple node V5 to perturbation element 322. In the write phase, node V5 is held to ground to allow $I_{WRITE}$ to flow from synaptic circuit 310, through node 325, and to a ground potential at node V5. The write phase has completed when after a duration that is variable or selectable for a desired state switching behavior of perturbation element 322.

After the write phase, a read phase commences between $t_1$ and $t_2$. This read phase allows for checking of the state of perturbation element 322 to determine if the state has changed from the initial phase to a final phase. In the read phase, synaptic circuit 310 is decoupled from neuron elements 320 by disabling transistor 319 by setting node V1 to ground. Node V2 is taken to $V_{DD}$ which couples a terminal associated with pinned layer 352 of reference element 321 to ground at node V4. Node V3 remains at $V_{DD}$ while node V5 is briefly driven to a level between ground and $V_{DD}$. This voltage level is referred to as $V_{READ}$ and produces a voltage spike at node 325 if perturbation element 322 has changed state from the initial state. If no change in state of transistor 324 occurs, then no voltage spike is produced. During the read phase, a small current $I_{READ}$ flows through perturbation element 322, node 325, and reference element 321 in series. Reference element 321 has a magnetization state held in a predetermined state. When perturbation element 322 is switched into an opposite magnetization state as reference element 321, an output is produced at node 325. This output can comprise a voltage spike, which can be further conditioned by logic inverter 331 to produce $V_{SPIKE}$.

If no voltage spike is produced during the read phase, then another write phase can occur as described above. Repeated write phases ($t_2$-$t_3$) and read phases ($t_3$-$t_4$) can occur until a voltage spike is produced as an output. Once the voltage spike is detected, a reset phase ($t_4$-$t_5$) can be performed. The reset phase includes deactivating transistor 319 to decouple synaptic circuit 310 from neuron element 320, which may already be decoupled from a previous read phase. A terminal associated with pinned layer 352 of reference element 321 is coupled to ground at node V4, while a terminal associated with pinned layer 355 of perturbation element 322 is coupled to $V_{RESET}$ at node V5. A small reset current flows through perturbation element 322, node 325, and reference element 321 to induce a state change in perturbation element 322 back to the initial state. After reset, further write phases ($t_5$-$t_6$) and read phases ($t_6$-$t_7$) can occur to attempt to change the state of perturbation element 322.

The various magnetization states of perturbation element 322 and reference element 321 can comprise either parallel (P) states or anti-parallel (AP) states. In one example, reference element 321 is held in an AP state, while perturbation element 322 is reset into an initial AP state. If the AP state of perturbation element 322 changes to the P state, then a voltage spike is produced when the read current is applied due in part to the states of perturbation element 322 and reference element 321 being in opposite states. If the AP state of perturbation element 322 does not change to the P state, then a voltage spike is not produced when the read current is applied, and perturbation element 322 remains in the AP state. Alternatively, different initial state configurations might be employed, with associated control voltages V2-V5 applied. For example, reference element 321 could instead be held in a magnetization state comprising a P state, while perturbation element 322 is reset into a P state. If the initial P state of perturbation element 322 changes to the AP state, then a voltage spike is produced when an appropriate read current is applied.

As used herein, the various voltage levels or logic levels are merely exemplary. Appropriate electrical voltages, reference potentials, and logic levels can be employed depending upon the circuit configuration, grounding configuration, and surrounding control/logic circuitry. In a specific example, $V_{DD}$ comprises a logic high level with respect to a logic low comprising a reference potential, ground potential, or reference voltage. $V_{DD}$ might be 3.3 VDC, while logic low might be 0 VDC. $V_{READ}$ might be a voltage lower than $V_{DD}$, such as 2.0 VDC, among other voltages. $V_{RESET}$ comprises a higher voltage than $V_{READ}$, and may comprise $V_{DD}$ or even higher voltages.

Figure 5:
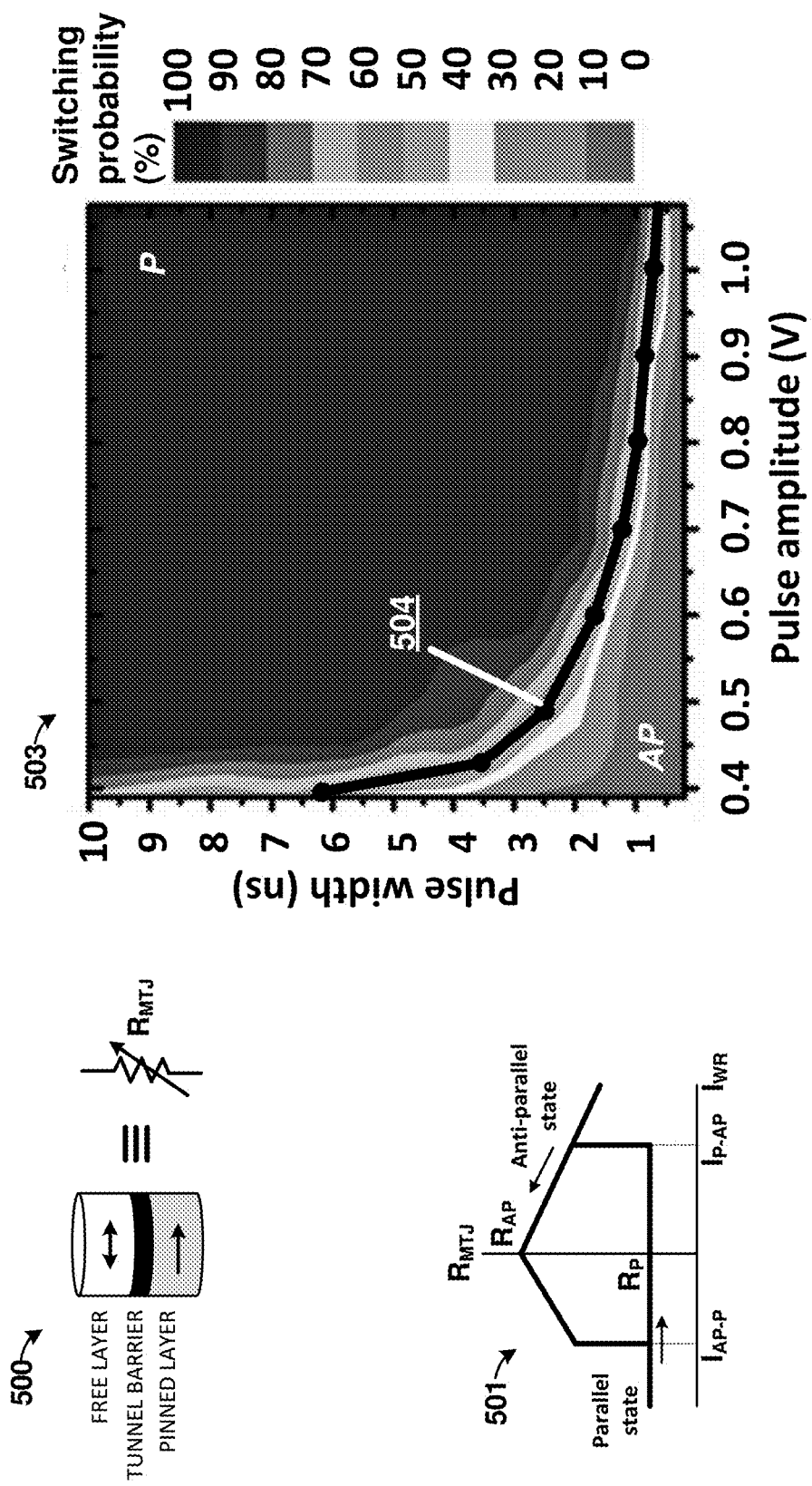
FIG. 5 illustrates example state operations of magnetic tunnel junction elements.

To further illustrate the state changes among MTJ elements, FIG. 5 is presented. FIG. 5 illustrates operation of MTJ elements that switch states among an anti-parallel (AP) state and parallel (P) state. Example MTJ configuration is shown having a pinned layer, tunnel barrier layer, and free layer. The pinned layer typically has a magnetization fixed in a particular orientation, such as shown in FIG. 5. The free layer can change orientation according to applied currents or voltages. When both the pinned layer and free layer are in the same magnetic orientation, then the two layers can be considered in the 'parallel' state. When the pinned layer and free layer are in different magnetic orientations, then the two layers can be considered in the 'anti-parallel' state. This MTJ configuration can be represented schematically as a state-alterable resistor element shown in configuration 500.

To change states among the MTJ, such as by changing relative magnetic orientations among the pinned layer and free layer, current pulses can be applied to the MTJ. Graph 501 illustrates one example state change arrangement. Graph 501 shows how application of a synaptic/write current ($I_{WR}$), an MTJ can be placed from an initial AP state into a subsequent P state, and from an initial P state into a subsequent AP state. Hysteresis-like behavior is exhibited, where a sufficient magnitude and duration of the write current is needed to change the state of the MTJ once it has changed into another state. The various P and AP states have an associated resistance ($R_{MTJ}$) associated therewith, indicated by the vertical axis in graph 501. In graph 501, the AP state has a high associated resistance ($R_{AP}$) relative to the P state, while the P state has a low associated resistance ($R_P$) relative to the AP state. These resistance changes can be utilized to produce an output spike responsive to a read current, as discussed herein, when a perturbation MTJ is in a different state relative to a reference MTJ.

As mentioned above, a magnitude and duration of the write current can influence the state change timing. Typically, a current pulse or pulse train is applied to an MTJ to attempt to change the state of the MTJ. As seen in graph 503, this current pulse can have a pulse width and pulse amplitude. The pulse width can be represented in seconds (or nanoseconds in FIG. 5), while the pulse amplitude can be represented in a voltage or amperage. FIG. 5 illustrates a voltage amplitude, which can induce a write current for the MTJ. Insufficient pulse width or pulse amplitude can lead to non-switching of the state of the MTJ, as associated magnetization starts leaking once the applied pulse is removed. A sufficient pulse width or pulse amplitude, or a sufficient series of pulses, can lead to switching of states by the MTJ. Thus, the MTJ can emulate behavior of a biological neuron. The firing or "spiking" of a biological neuron, which occurs when neuron cell membrane potential crosses a threshold, is equivalent to the switching of the MTJ. Random thermal fluctuation in an MTJ can be utilized for generating random bits. Switching probability is a strong function of the applied perturbation voltage and perturbation pulse width. Once the artificial neuron (MTJ) "spikes," the MTJ has to be reset back to the initial state. Hence, the operation of the neuron MTJ can be resolved into two cycles, namely a "write" phase followed by a "read" phase indicated above.

Graph 503 of FIG. 5 provides an illustration of characterization of behavior of an MTJ under various pulse widths (in nanoseconds) along the vertical axis and various pulse amplitudes (in voltage) along the horizontal axis. A 50% contour line 504 is shown to illustrate an example characteristic behavior of a true random number generator (TRNG) behavior of an MTJ for a range of pulse widths and pulse amplitudes. Each contour shade indicates a region of associated switching probability for an MTJ from an AP state to a P state. The various synaptic currents or neuron write currents discussed herein can be tailored to suit a desired behavior indicated by graph 503, such as a TRNG behavior, among others.

Figure 6:
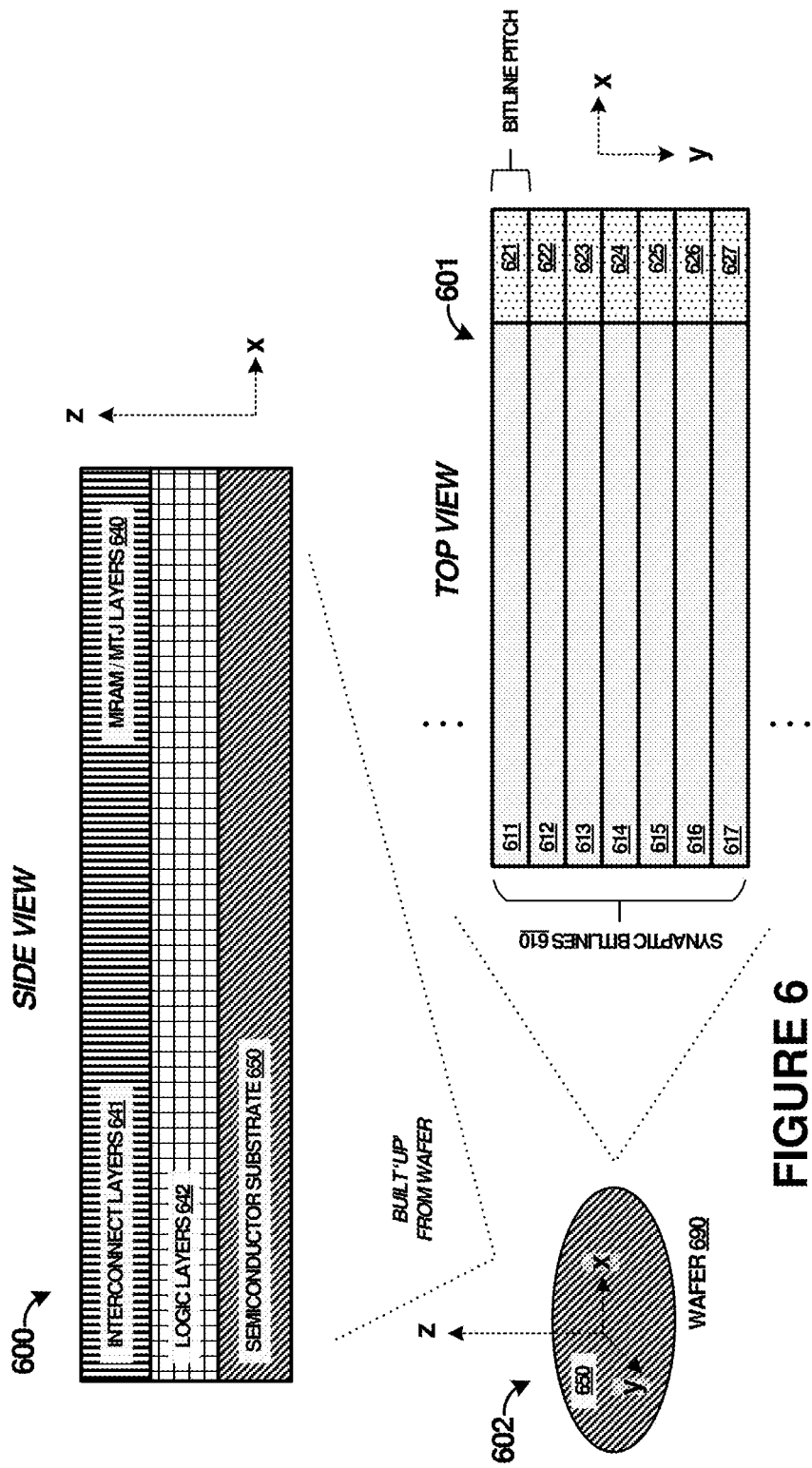
FIG. 6 illustrates an example array of neuron circuits on a semiconductor substrate.

Turning now to further implementations of artificial neurons comprising MTJs, FIG. 6 is presented. FIG. 6 illustrates example array of neuron circuits formed on a semiconductor substrate. This example array might comprise a magneto-resistive random-access memory (MRAM) array formed along with various control logic, interconnect, or other circuitry. In some examples, an MRAM array will have wordlines and bitlines comprised of MRAM devices spanning horizontally with respect to a substrate. Other array configurations and arrangements of MRAM arrays and associated control/interconnect logic can instead be formed than that shown in FIG. 6, such as vertically stacked arrays.

Three views 600-602 are presented in FIG. 6. View 600 illustrates a side view of an example MRAM array with various control logic layers 642 formed up in a 'z' direction on semiconductor substrate 650. Interconnect layers 641 and MRAM/MTJ layers 640 are formed at least in part onto logic layers 642. Interconnect layers 641 comprise various metallization, metal layers, and other various interconnect to couple MRAM/MTJ elements to elements of logic layers 642. View 601 illustrates a top view of an MRAM array which is formed horizontally in the 'x' and 'y' directions onto logic layers 642. Interconnect layers 641 are omitted for clarity in view 601. View 602 presents an overview of a semiconductor wafer 690 spanning horizontally in 'x' and 'y' directions, which can have various semiconductor, metallization, and other associated structures built up in a vertical ('z') direction which form elements 640-642 and 650.

In view 601, MRAM bitlines (611-617) are formed horizontally, and may comprise MTJs, for example. MRAM bitlines (611-617) can have sense amplifiers or other read circuitry positioned at an end of each MRAM bitline. However, in this example, instead of (or in addition to) this read circuitry, a neuron circuit is added to each bitline. This neuron circuits (621-627) fits within the pitch of each associated bitline. The neuron circuitry can comprise element illustrated in FIG. 3, such as neuron elements 320, output elements 330, and in some cases, a switching element between the bitline and the neuron elements (such as transistor 319 of FIG. 3).

Thus, an array of neuron bitlines 610 can be provided in view 601 of FIG. 6. Each neuron circuit 621-627 can be fed a synaptic current produced by an associated MRAM bitlines 611-617. This array can be formed along with other elements, such as metallization, interconnect, control circuitry, and logic used to interconnect, control, and otherwise interface with each neuron bitline. Elements of control system 140 can be included in control logic 642 and interconnect 641. These elements can be formed, as illustrated in view 600, onto a semiconductor substrate 650 using techniques found in semiconductor wafer processing and microfabrication, such as photo-lithography, diffusing, deposition, epitaxial growth, etching, annealing, and ion implanting, among others.

Furthermore, each of the neuron bitlines can be interconnected, such as using interconnect 641 in view 600. Outputs from individual neuron bitlines can be used as inputs to other neuron bitlines. Complex interconnections can be formed, and dynamic interconnection can be provided using interconnect 641 and control logic 642, among other elements. In this manner, an artificial neural network (ANN) can be formed using bitlines with neuron circuits included in vertical pitch of each bitline. In yet further examples, outputs of each neuron circuit can be provided to a microprocessor, central processing unit, graphics processing unit, application-specific integrated circuitry, or field-programmable gate array, among other circuitry, for processing and dynamic interconnection.

In some implementations of the systems, circuitry, and elements discussed herein, a stochastic circuit can be established. This stochastic circuit can include a means for selectively producing a synaptic current from a source circuit though a perturbation element coupled to a node to stochastically influence a state change of the perturbation element from an antiparallel magnetization state to a parallel magnetization state. The stochastic circuit can also include a means for selectively producing a read current through the perturbation element and a reference element coupled by the node. The stochastic circuit can also include a means for producing an output at the node representative of a present magnetization state of the perturbation element. The stochastic circuit can also include a means for selectively producing a reset current through the perturbation element and the reference element coupled by the node to place the perturbation element into an initial state comprising the antiparallel magnetization state.

The means for selectively producing the synaptic current can comprise any of synaptic circuit 110, control system 140, one or more links 161, link 165, write current source 310, synaptic bitline 340, transistor switch 319, MRAM bitlines 611-617, logic layers 640, and interconnect 641, among other elements discussed herein. The means for selectively producing the read current can comprise any of control system 140, links 162, neuron circuit 120, transistors 323-324, MTJ elements 321-322, node 325, and logic layers 640, among other elements discussed herein. The means for producing an output at the node can comprise any of neuron circuit 120, link 162, link 166, link 163, output circuit 130, transistors 323-324, MTJ elements 321-322, node 325, output elements 330, inverter 331, and logic layers 640, among other elements discussed herein. The means for selectively producing a reset current can comprise any of neuron circuit 120, link 162, link 166, link 163, output circuit 130, transistors 323-324, MTJ elements 321-322, node 325, output elements 330, inverter 331, and logic layers 640, among other elements discussed herein.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the invention is not limited to the specific embodiments described above, but only by the claims and their equivalents.

What is claimed is:

1. A circuit comprising:
a perturbation magnetic tunnel junction (MTJ) element;
a reference element;
an output node coupling a free layer of the perturbation MTJ element and a first terminal of the reference element to a synaptic current source, wherein the synaptic current source comprises a plurality of MTJ elements connected in parallel and a selection element to selectively couple a synaptic current from the plurality of MTJ elements to the output node;
a read current source coupled to a pinned layer of the perturbation MTJ element; and
a reference potential coupled to a second terminal of the reference element.

2. The circuit of claim 1, wherein the perturbation MTJ element comprises a first perpendicular spin transfer torque (STT) MTJ element having an alterable magnetization state, and wherein the reference element comprises a second perpendicular STT MTJ with a magnetization state held in a predetermined state.

3. The circuit of claim 1, wherein the synaptic current source comprises at least a first selection element to selectively couple a synaptic current to the output node, wherein the read current source comprises at least a second selection element to selectively couple one of a read current and a reset current to the pinned layer of the perturbation MTJ element, and wherein circuitry supplying the reference potential comprises a third selection element to selectively couple an electrical reference to the second terminal of the reference element.

4. The circuit of claim 1, wherein the perturbation MTJ element and the reference element form a voltage divider having an output voltage at the output node.

5. An apparatus comprising:
a perturbation magnetic tunnel junction (MTJ) element coupled to a control line through a node; and
a reference MTJ element coupled to the control line through the node;
wherein during a synaptic phase, the perturbation MTJ element changes state probabilistically in response to a synaptic current provided by the control line through the node; and
wherein during a read phase, a read current established between the perturbation MTJ element and the reference MTJ element results in an output at the node representative of the state of the perturbation MTJ element
wherein a synaptic current source that feeds the control line comprises a plurality of MTJ elements coupled in parallel, and a selection element to selectively couple a synaptic current from the plurality of MTJ elements to the node.

6. The apparatus of claim 5, wherein the output comprises a voltage spike at the node that results from passing the read current through at least the perturbation MTJ element when the perturbation MTJ element is in an opposite magnetization state relative to the reference MTJ element.

7. The apparatus of claim 5, wherein the read current is introduced to a terminal of the perturbation MTJ element opposite the node, wherein a terminal of the reference MTJ element opposite the node is coupled to a ground potential to form a voltage divider between the perturbation MTJ element and the reference MTJ element, and wherein the output comprises a voltage spike resultant from the read current based on a magnetization state of at least the perturbation MTJ element.

8. The apparatus of claim 5, wherein a free layer of the perturbation MTJ element is coupled to the node, and a free layer of the reference MTJ is coupled to the node.

9. The apparatus of claim 5, further comprising:
responsive to a reset current established through at least the perturbation MTJ element, the perturbation MTJ element is reset into an antiparallel magnetization state, and wherein the reference MTJ element comprises a magnetization state held in an antiparallel state.

10. The apparatus of claim 5, wherein an alternating application of the synaptic current and the read current is repeated until a voltage spike at the node is produced as the output responsive to the read current.

11. The apparatus of claim 5, wherein varying properties of the synaptic current provided by the plurality of MTJ elements influences a probabilistic behavior of the perturbation MTJ element.

12. A method comprising:
during a write phase, sending a synaptic current from a source circuit through a perturbation magnetic tunnel junction (MTJ) element coupled to a node to stochastically influence a magnetization state of the perturbation MTJ element, wherein the source circuit comprises a plurality of MTJ elements connected in parallel and a selection element to selectively couple the synaptic current from the plurality of MTJ elements to the node; and
during a read phase, isolating the source circuit from the node, sending a read current through the perturbation MTJ element and a reference MTJ element coupled by the node, and producing an output voltage at the node representative of the magnetization state of the perturbation MTJ element.

13. The method of claim 12, further comprising:
repeating the write phase and the read phase until a voltage spike occurs at the node during the read phase indicating a change in the magnetization state of the perturbation MTJ element from an initial magnetization state to an opposite magnetization state relative to the reference MTJ element.

14. The method of claim 13, further comprising:
during a reset phase, sending a reset current through the perturbation MTJ element and the reference MTJ element coupled by the node to place the perturbation MTJ element into the initial state comprising an antiparallel magnetization state.

15. The method of claim 12, further comprising:
during the read phase, introducing the read current to a terminal of the perturbation MTJ element opposite the node, and coupling a terminal of the reference MTJ element opposite the node to a ground potential.

16. The method of claim 12, further comprising:
during the write phase, sending the synaptic current from the plurality of MTJ elements coupled in parallel, wherein the plurality of MTJ elements each output a corresponding portion of the synaptic current that stochastically influences a change in the magnetization state of the perturbation MTJ element.

17. A system to produce a probabilistic output, comprising:
a synaptic current source comprising:
a plurality of magnetic tunnel junction (MTJ) elements that together provide a synaptic current;
a first switching element configured to selectively provide the synaptic current to a node of a neuron circuit during a write phase;
the neuron circuit comprising:
a perturbation MTJ element;
a reference MTJ element;
the node coupling a free layer of the perturbation MTJ element and a free layer terminal of the reference MTJ element, wherein an output produced at the node during a read phase comprises the probabilistic output;
a second switching element configured to couple a read potential to a pinned layer of the perturbation MTJ element during the read phase and couple a reference potential to the pinned layer of the perturbation MTJ element during the write phase; and
a third switching element configured to couple the reference potential to a pinned layer of the reference MTJ element during the read phase and decouple the reference potential from the pinned layer of the reference MTJ during the write phase.

18. The system of claim 17, wherein:
the second switching element is further configured to couple a reset potential to the pinned layer of the perturbation MTJ element during a reset phase; and
the third switching element is further configured to couple the pinned layer of the reference MTJ element to the reference potential during the reset phase.

19. The system of claim 17, further comprising:
an output element configured to present an output voltage indicating the probabilistic output, wherein a first output voltage level indicates at least the perturbation MTJ element was probabilistically placed in an opposite magnetization state relative to the reference MTJ element responsive to the synaptic current.

20. The system of claim 17, wherein magnitude and duration properties of the synaptic current provided by the synaptic current source influences a probabilistic magnetization state change in the perturbation MTJ element.

21. The system of claim 17, wherein the perturbation MTJ element undergoes a probabilistic magnetization state change in response to the synaptic current and at least thermal noise present in the perturbation MTJ element.

22. The system of claim 17, further comprising:
interconnect elements configured to interconnect an output representing the probabilistic output produced at the node as an input to one or more other synaptic current sources associated with one or more further neuron circuits.

23. A stochastic device comprising:
means for selectively producing a synaptic current through a perturbation element coupled to a node to stochastically influence a state change of the perturbation element from an antiparallel magnetization state to a parallel magnetization state; and
means for selectively producing a read current through the perturbation element and a reference element coupled with the perturbation element by the node; and
means for producing an output at the node representative of a present magnetization state of the perturbation element.

24. The stochastic device of claim 23, further comprising:
means for selectively producing a reset current through the perturbation element and the reference element coupled by the node to place the perturbation element into an initial state comprising the antiparallel magnetization state.

* * * * *